United States Patent
Vaiana et al.

(10) Patent No.: US 11,275,100 B2
(45) Date of Patent: Mar. 15, 2022

(54) AMPLIFICATION INTERFACE, AND CORRESPONDING MEASUREMENT SYSTEM AND METHOD FOR CALIBRATING AN AMPLIFICATION INTERFACE

(71) Applicant: STMicroelectronics S.r.l., Agrate Brianza (IT)

(72) Inventors: Michele Vaiana, San Giovanni la Punta (IT); Calogero Marco Ippolito, Aci Castello (IT); Angelo Recchia, Fasano (IT); Antonio Cicero, Palermo (IT); Pierpaolo Lombardo, Calascibetta (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 101 days.

(21) Appl. No.: 16/781,598

(22) Filed: Feb. 4, 2020

(65) Prior Publication Data
US 2020/0256898 A1 Aug. 13, 2020

(30) Foreign Application Priority Data
Feb. 8, 2019 (IT) .................. 102019000001847

(51) Int. Cl.
*H03F 1/02* (2006.01)
*G01R 19/00* (2006.01)
(Continued)

(52) U.S. Cl.
CPC ..... *G01R 19/0038* (2013.01); *G01R 19/0069* (2013.01); *G05F 3/08* (2013.01);
(Continued)

(58) Field of Classification Search
CPC ............ G01R 19/0038; G01R 19/0069; G01R 19/2506; G05F 3/08; H03B 5/04;
(Continued)

(56) References Cited

U.S. PATENT DOCUMENTS 6,583,398 B2 * 6/2003 Harkin .................. H04N 5/378
250/208.1
6,590,463 B2 7/2003 Lin
(Continued)

OTHER PUBLICATIONS

IT Search Report and Written Opinion for IT Appl. No. 102019000001847 dated Oct. 23, 2019 (9 pages).
(Continued)

*Primary Examiner* — Khanh V Nguyen
(74) *Attorney, Agent, or Firm* — Crowe & Dunlevy

(57) ABSTRACT

An amplification interface includes an input terminal receiving a sensor current and an output terminal supplying an output voltage. An analog integrator is connected to the input terminal and supplies the output voltage. A current generator is connected to the input of the analog integrator and generates a compensation current based on a drive signal. A control circuit generates the drive signal for the current generator based on a control signal representing an offset in the sensor current supplied by the sensor. The current generator generates, based on the driving signal, a positive or negative current. The control circuit determines a first duration and a second duration as a function of the control signal representing the offset in the sensor current, during the measurement interval, and sets the driving signal to a first logic value for the first duration and to a second logic value for the second duration.

21 Claims, 4 Drawing Sheets

(51) Int. Cl.
  *G05F 3/08* (2006.01)
  *H03B 5/04* (2006.01)
  *H03F 3/45* (2006.01)

(52) U.S. Cl.
  CPC ............ *H03B 5/04* (2013.01); *H03F 1/0205* (2013.01); *H03F 3/4565* (2013.01)

(58) Field of Classification Search
  CPC ................ H03F 1/0205; H03F 3/4565; H03F 2203/45514; H03F 3/087; H03F 3/45475; H03M 1/129
  See application file for complete search history.

(56) References Cited

U.S. PATENT DOCUMENTS

| | | | |
|---|---|---|---|
| 6,693,485 B1 | 2/2004 | Huber | |
| 7,268,338 B2* | 9/2007 | Liu | H04N 5/243 250/214 A |
| 8,159,206 B2 | 4/2012 | Chao et al. | |
| 8,284,090 B2 | 10/2012 | Maurino | |
| 9,778,804 B2* | 10/2017 | Liu | G06F 3/044 |
| 2006/0244067 A1 | 11/2006 | Socher et al. | |
| 2007/0030069 A1 | 2/2007 | Huang | |
| 2009/0290626 A1 | 11/2009 | Thurston et al. | |
| 2011/0279181 A1 | 11/2011 | Fan | |
| 2011/0315880 A1 | 12/2011 | Nemirovsky | |
| 2013/0207727 A1* | 8/2013 | Kusuda | H03F 1/26 330/296 |
| 2014/0266435 A1 | 9/2014 | Botker | |
| 2016/0065133 A1 | 3/2016 | Cong et al. | |
| 2017/0205366 A1 | 7/2017 | Nemirovsky | |
| 2018/0131342 A1 | 5/2018 | Zamprogno et al. | |

OTHER PUBLICATIONS

Christoffersen, Carlos et al.: "An Ultra-Low Power CMOS PTAT Current Source," IEEE Catalog No. CFP1054E-CDR, Proceedings of the Argentine School of Micro-Nanoelectronics, Technology and Applications 2010, pp. 35-40.

Fonstad, Clifton: "MOSFETs in the Sub-threshold Region (i.e. a bit below Vt)," MIT OpenCourseWare, http://ocw.mit.edu, 6.012 Microelectronics Devices and Circuits, Fall 2009, Oct. 28, 2009 (17 pages).

Kleczek, Rafal, et al.: "Low Voltage Area Efficient Current-Mode CMOS Bandgap Reference in Deep Submicron Technology," MIXDES 2014, 21st International Conference, Mixed Design of Integrated Circuits and Systems, Jun. 19-21, 2014, Lublin, Poland, pp. 247-251.

Nemirovsky Yael et al.: "A New Pellistor-Like Gas Sensor Based on Micromachined CMOS Transistor", IEEE Transactions on Electron Devices, IEEE Service Center, Pisacataway, NJ, US, vol. 65, No. 12, Dec. 1, 2018, pags 5494-5498.

Shan Hengying et al.: "A low power CMOS temperature sensor fronted for RFID tags", 2018 IEEE 18th Topical Meeting on Silicon Monolithic Integrated Circuits in RF Systems (SIRF), IEEE, Jan. 14, 2018, pp. 15-18.

Yousset, Mohamed A., et al.: "A Novel CMOS Realization of the Differential Input Balanced Output Current Operational Amplifier and its Applications," Analog Integrated Circuits and Signal Processing, 44, 37-53, 2005, Springer Science & Business Media, Inc.

* cited by examiner

AMPLIFICATION INTERFACE, AND CORRESPONDING MEASUREMENT SYSTEM AND METHOD FOR CALIBRATING AN AMPLIFICATION INTERFACE

PRIORITY CLAIM

This application claims the priority benefit of Italian Application for Patent No. 102019000001847, filed on Feb. 8, 2019, the content of which is hereby incorporated by reference in its entirety to the maximum extent allowable by law.

TECHNICAL FIELD

The embodiments of the present description refer to measurement systems.

BACKGROUND

FIG. 1 shows a typical measurement system. In general, the measurement system comprises a sensor 10 and a processing circuit 40.

In particular, the sensor 10 is configured for supplying a measurement signal MS representing a quantity to be measured. For example, the sensor 1 may be an environmental sensor, such as a temperature sensor, a brightness sensor, etc. Instead, the processing circuit 40 is configured for processing the measurement signal MS.

Typically, the measurement signal MS is not directly supplied to the processing circuit 40, but an amplification circuit 20 is configured for generating an amplified measurement signal AS. In general, the amplification circuit 20 is able to carry out various operations. For example, with sensors that supply a current signal as output, the amplification circuit 20 can supply a voltage signal as output. In addition, the amplification circuit 20 may be configured for amplifying the variation of the measurement signal MS in such a way as to cover, preferably with its maximum variation, the input dynamic range of the circuit downstream.

For example, frequently, the processing circuit 40 is a digital circuit, such as a microprocessor programmed via software code. In this case, the processing circuit 40 has an analog-to-digital (A/D) converter 30 associated therewith and configured for receiving at input the amplified signal AS and for supplying at its output a digital signal DS that comprises digital samples of the amplified signal AS. Consequently, in this architecture, it would be expedient for the amplification circuit 20 to be configured for amplifying the variation of the measurement signal MS in such a way as to cover the input dynamic range of the A/D converter 30.

A common issue that is encountered in the design of such an electronic amplification interface 20 for a sensor 10 is that the maximum variation of the measurement signal MS produced by the sensor 10 on account of the variation of the quantity to be measured may frequently be comparable to (or even much lower than) the offset of the sensor itself on account of process spread and/or mismatch. This problem is then accentuated by the fact that the signal MS produced by the sensor 10 frequently has to be amplified by a very high amplification factor. For this reason, offset correction assumes a fundamental role when the aim is to design an electronic amplification interface 20 for a sensor 10.

For instance, FIG. 2 shows an example of an electronic amplification interface in which the sensor 10 is a photodiode D1, but also other sensors 10 may be used, which produce a measurement current.

In general, a photodiode is a semiconductor device that converts light (or electromagnetic radiation in general) into an electric current. In particular, in a photodiode, conversion into a current signal is carried out by a PN junction, since absorbed photons produce an electron-hole pair in the depletion region.

When the aim is to design an electronic interface for amplifying the current produced by a photodiode D1, the leakage current of the photodiode D1 should be taken into account. For example, it would be expedient for the amplification circuit to be configured in such a way that the undesired contribution produced by the leakage current is much lower than the contribution produced by the absorbed photons. In particular, the leakage current is substantially an offset in the measurement signal MS that the amplification circuit should compensate in such a way as to amplify principally the contribution produced by the absorbed photons.

FIG. 2 also shows a possible circuit scheme that may be used for amplifying the current signal produced by a sensor 10 (photodiode D1).

In particular, in the example considered, the amplification circuit is configured for receiving as input a current signal and supplying as output a voltage signal $V_{out}$. Basically, in the example considered, the amplification is provided via an analog integrator 20. For example, in the example considered, the above analog integrator 20 is implemented with:

an operational amplifier 202, where a first input terminal (typically the negative terminal) is connected to the sensor 10/photodiode D1, and the second input terminal (typically, the positive terminal) is connected to a reference voltage Vref; and a feedback circuit, connected between the first input terminal and the output terminal of the operational amplifier 202, where the feedback circuit comprises a capacitor Cfb.

Consequently, in the example considered, the current supplied by the sensor 10 (photodiode D1) charges the capacitor Cfb, and the voltage $V_{out}$ on the output terminal of the operational amplifier 202 corresponds to the sum of the reference voltage Vref and the voltage on the capacitor Cfb. Consequently, the output voltage $V_{out}$ (which represents the amplified signal AS) increases/decreases as a function of the amplitude of the current supplied by the sensor 10 (photodiode D1), which hence represents the measurement signal MS.

In the example considered, an electronic switch $SW_{RST}$ is connected in parallel with the capacitor Cfb. Basically, the electronic switch $SW_{RST}$ enables discharge/reset of the capacitor Cfb. Consequently, in the case where the processing circuit 40, for example using the A/D converter 30, reads the value of the voltage $V_{out}$ after a given time interval (from a reset carried out by the switch $SW_{RST}$), the value of the amplified output signal $V_{out}$/AS corresponds to the value assumed by the ramp at the end of the time interval, which in turn represents the current supplied by the sensor 10. At the end of each time interval, the capacitor Cfb can then be reset/discharged again via the switch $SW_{RST}$.

FIG. 2 also schematically represents the offset contribution, denoted by ID1. As explained previously, the contribution/offset of the signal MS is present even in the absence of light. Moreover, frequently this contribution ID1 is variable from one component to another on account of the process spread of the sensor 10. Likewise, the operational amplifier 202 itself may have an offset voltage at its input. Hence, this offset contribution adds to the useful contribution due to the quantity to be measured, and in many cases the amplitude of the aforesaid useful contribution may be even lower than the offset contribution. Hence, the offset can be removed or at least in part compensated, for example through an appropriate calibration procedure, if is intended to ensure proper operation within the operating dynamic range of the output voltage $V_{out}$ and/or within the input dynamic range of the circuit downstream, for example the A/D converter 30.

A first approach according to the known art that can be adopted for calibrating the offset of the voltage $V_{out}$ is presented in FIG. 3.

In the example considered, the offset is corrected within the processing circuit in the digital domain, i.e., after conversion into the digital domain by the A/D converter 30. For example, for this purpose, the processing circuit 40 may comprise a memory 406, stored in which is a variable DOFFSET, which identifies the offset that is to be cancelled from the digital signal DS. This variable DOFFSET is read by a circuit and/or software module 402, which is configured for subtracting the value DOFFSET from the value of the digital sample DS. Finally, the resulting signal can be processed by a further circuit and/or software module 404.

Consequently, in this approach, the offset contribution of the measurement signal MS is amplified together with the useful contribution. Hence, this entails the risk of overstepping the operating dynamic range of the output voltage $V_{out}$, or else alternatively an oversizing of the output dynamic range of the amplification chain is to be used.

A second approach according to the known art that can be adopted for calibrating the offset of the voltage $V_{out}$ is presented in FIG. 4.

In the example considered, the offset is corrected in an analog way by a current generator 50. In particular, this current generator 50 is configured for generating a compensation current $i_{COMP}$ that is applied to the input of the amplification circuit 20, which in the example considered corresponds to the first terminal of the operational amplifier 202. Consequently, in the example considered, the compensation current $i_{COMP}$ adds to the current supplied by the sensor 10/photodiode D1. Hence, by setting the value of the compensation current $i_{COMP}$, it is possible to eliminate (or at least reduce) the offset contribution ID1 from the measurement signal MS that is supplied to the amplification circuit 20.

For example, this is shown schematically in FIG. 4, where a feedback circuit 60 generates a feedback/control signal FB for the current generator 50 as a function of the amplified signal AS supplied by the amplification circuit 20, for example as a function of the voltage $V_{out}$. For instance, an approach of this type is described in U.S. Patent Application Publication No. 2018/0131342 A1, the contents of which are incorporated herein for reference. For example, in this approach, the current generator 50 may be a current generator that receives an analog signal (reference 328 in the document cited) and/or a current generator that receives a digital signal (reference 42 in the document cited).

For example, FIG. 4 shows a current generator 50 that receives at input a digital signal, namely, a so-called IDAC (Current Digital-to-Analog Converter). For instance, as shown schematically in FIG. 4, such a current generator 50 may comprise a first set of a number N of current generators $52_1, \ldots, 52_N$ configured for supplying the same current $I_{FS}/N$. Each of these current generators $52_1, \ldots, 52_N$ has a respective associated electronic switch $54_1, \ldots, 54_N$, which makes it possible to enable the respective current generator $52_1, \ldots, 52_N$. In particular, the current generators $52_1, \ldots, 52_N$ are configured for applying a positive current to the output terminal of the current generator 50. Likewise, the current generator 50 may comprise a second set of a number N of current generators $58_1, \ldots, 58_N$ configured for supplying all the same current $-I_{FS}/N$. Each of these current generators $58_1, \ldots, 58_N$ has an associated respective electronic switch $56_1, \ldots, 56_N$, which makes it possible to enable the respective current generator $58_1, \ldots, 58_N$. In particular, the current generators $58_1, \ldots, 58_N$ are configured for applying a negative current to the output terminal of the current generator 50.

Consequently, by closing one or more of the electronic switches $54_1, \ldots, 54_N$ or $56_1, \ldots, 56_N$ it is possible to choose the value of the current $i_{COMP}$ supplied by the current generator 50. In particular, in the example considered, the current generator 50 is configured for generating a current that may be positive or negative. However, if the sign of the offset in the measurement signal MS is known, the current generator 50 could even generate only positive currents or negative currents.

Consequently, in the example considered, the analog integrator 20 can be reset periodically, by sampling the respective "end-of-ramp" value, i.e., the value assumed by the voltage $V_{out}$ shortly before start of reset.

Instead, the feedback signal FB can be determined once, for example during a calibration step, in which the sensor 10 is in a static condition and generates the offset contribution ID1, for instance, in the absence of light. Consequently, by knowing the signal FB it is possible to choose the control signals for the electronic switches $54_1, \ldots, 54_N$ or $56_1, \ldots, 56_N$ that are used for generating a current $i_{COMP}$ that is able to compensate for the aforesaid offset contribution ID1. Consequently, the respective control signals may also be stored; i.e., the feedback circuit 60 can be used during the calibration step. Consequently, these control signals may be fixed by a combinational logic and remain unvaried in time.

For example, in the simplest case there may be a digital signal $B_{CTRL}$ stored that indicates the number of current generators $52_1, \ldots, 52_N$ and $58_1, \ldots, 58_N$ that are to be enabled. For instance, the current supplied by the current generator 50 may correspond to:

$$i_{COMP} = \frac{I_{FS}}{N} B_{CTRL} \quad (1)$$

where the value $B_{CTRL}$ is an integer (comprised between $-N$ and N).

Consequently, in the example considered and in the absence of a signal applied to the sensor 10, the voltage $V_{out}$ corresponds to:

$$V_{out}(T) = \frac{T}{Cfb}\left(\frac{I_{FS}}{N} B_{CTRL} + ID1\right) \quad (2)$$

where T corresponds to the measurement period used by the amplification circuit 20.

Consequently, during the calibration step (in the absence of any signal applied to the sensor), the value $B_{CTRL}$ may be chosen and fixed to the value that renders Eq. (2) as close as possible to zero. Hence, the offset current may be corrected within an interval ranging between $-I_{FS}$ and $+I_{FS}$ with a resolution of correction equal to $I_{FS}/N$. Therefore, to reduce the aforesaid residual error from the offset correction, the unit current (i.e., $I_{FS}/N$) supplied by the current generators 52 and 58 is to be decreased. However, in some cases, this current should be around, or even lower than, 1 nA. However, such low currents cannot be obtained easily in an accurate way.

Considering the foregoing, there is a need in the art to provide approaches that will be able to overcome one or more of the limits of the known art.

SUMMARY

According to one or more embodiments, one or more of the above objects are achieved by an amplification interface having the distinctive elements set forth specifically in the ensuing claims. The embodiments moreover concern a corresponding measurement system and a method for calibrating an amplification interface.

As mentioned previously, various embodiments of the present description regard an amplification interface. In particular, in various embodiments, the amplification interface includes an input terminal configured for being connected to a sensor that supplies a current, and an output terminal for supplying an output voltage.

In various embodiments, the amplification interface includes an analog integrator, a current generator which generates a compensation current, and a control circuit which controls operation of the analog integrator and of the current generator.

In particular, in various embodiments, the input of the analog integrator is connected to the input terminal of the amplification interface, i.e., the sensor, and the output of the analog integrator supplies the output voltage. For example, in a way similar to what has been described previously, the analog integrator may be configured for being reset or activated by a reset signal. For instance, when the analog integrator is reset, the output voltage corresponds to a reference voltage, and when the analog integrator is activated, the output voltage varies as a function of a current received on the input of the analog integrator. For example, in various embodiments, the analog integrator is implemented by an operational amplifier, where a first input terminal of the operational amplifier is connected through a capacitor to the output terminal of the operational amplifier, and a second input terminal of the operational amplifier is connected to a reference voltage. In this case, the analog integrator can be reset by an electronic switch connected in parallel to the capacitor.

In various embodiments, the current generator is configured for generating a compensation current as a function of a drive signal supplied by the control circuit. In particular, in various embodiments, the output of the current generator is connected to the input of the analog integrator; i.e., the analog integrator receives the sum of the current supplied by the sensor and of the compensation current.

Consequently, the control circuit can generate the reset signal in such a way that the analog integrator is periodically reset during a reset interval and activated during a measurement interval. Moreover, the control circuit can generate the drive signal for the current generator as a function of a control signal indicating an offset in the current supplied by the sensor.

However, whereas in the known art the current generator is implemented with a high-resolution IDAC, various embodiments of the present description use just one current generator configured for supplying alternatively, as a function of a driving signal, a positive current or a negative current. In particular, in various embodiments, the positive current and the negative current have one and the same amplitude but opposite sign. For example, for this purpose, the current generator may include a first current generator that generates the positive current, and a second current generator that generate the negative current. Moreover, the current generator may include circuitry for selectively enabling the first current generator or the second current generator as a function of the driving signal and/or circuitry for selectively connecting the first current generator or the second current generator to the output of the current generator as a function of the driving signal.

With a current generator of this type, the control circuit may hence not vary the amplitude of the positive current and of the negative current, but may determine for each measurement interval a first duration in which the current generator should supply the positive current and a second duration in which the current generator should supply the negative current; i.e., in various embodiments, the control circuit determines the duration as a function of the control signal representing the offset in the current supplied by the sensor. Consequently, the sum of the first duration and of the second duration corresponds to the duration of the measurement interval.

For example, in various embodiments, the control circuit is configured for generating the reset signal and the driving signal using a counter circuit in a synchronous way in response to a clock signal. In this case, the measurement interval may correspond to a number, preferably an even number, of sub-intervals, where the duration of each sub-interval corresponds to a multiple of the period of the clock signal. In this case, the control signal representing the offset in the current supplied by the sensor may hence be an integer that represents the number of sub-intervals during which the current generator is to supply the positive current and/or the number of sub-intervals during which the current generator is to supply the negative current.

BRIEF DESCRIPTION OF THE DRAWINGS

The embodiments of the present disclosure will now be described with reference to the annexed drawings, which are provided purely by way of non-limiting example and in which.

DETAILED DESCRIPTION

In the ensuing description, various specific details are illustrated aimed at enabling an in-depth understanding of the embodiments. The embodiments may be provided without one or more of the specific details, or with other methods, components, materials, etc. In other cases, known structures, materials, or operations are not shown or described in detail so that various aspects of the embodiments will not be obscured.

Reference to "an embodiment" or "one embodiment" in the framework of this description is meant to indicate that a particular configuration, structure, or characteristic described in relation to the embodiment is contained in at least one embodiment. Hence, phrases such as "in an embodiment", "in one embodiment", or the like that may be present in various points of this description do not necessarily refer to one and the same embodiment. Moreover, particular conformations, structures, or characteristics may be combined in any adequate way in one or more embodiments.

The references used herein are provided for convenience and hence do not define the sphere of protection or the scope of the embodiments.

Figure 1:
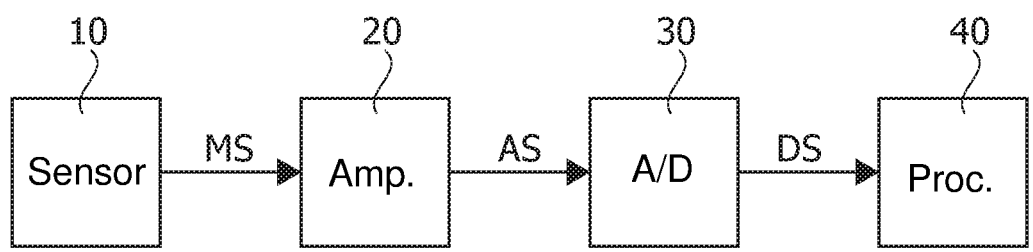
FIG. 1 shows a measurement system.
Figure 2:
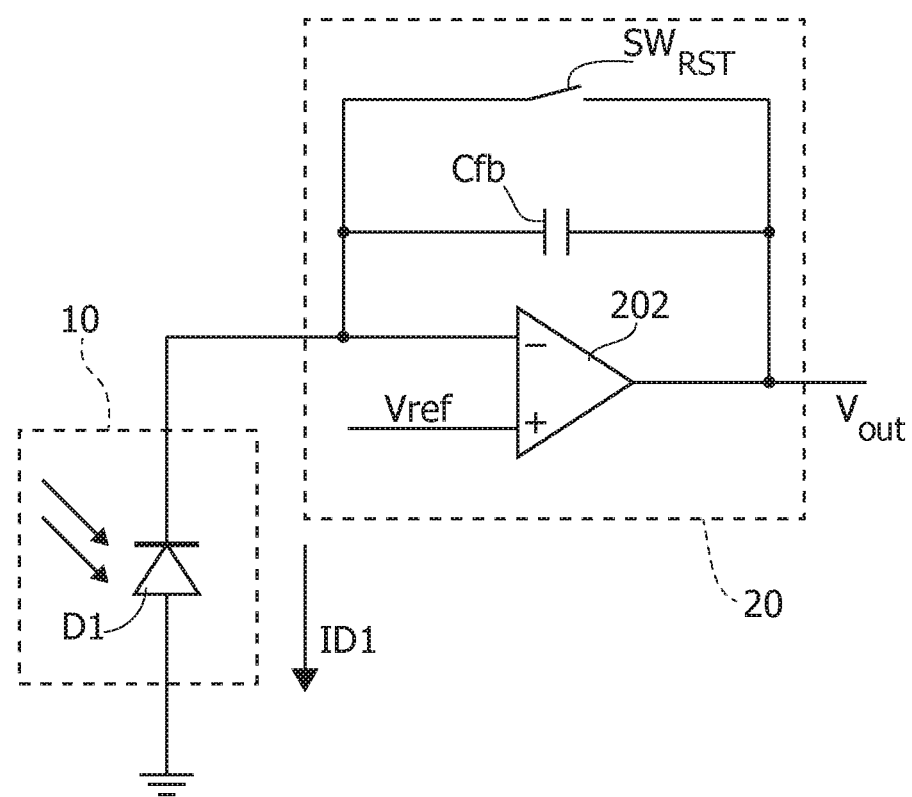
FIG. 2 shows an example of an amplification interface.
Figure 3:
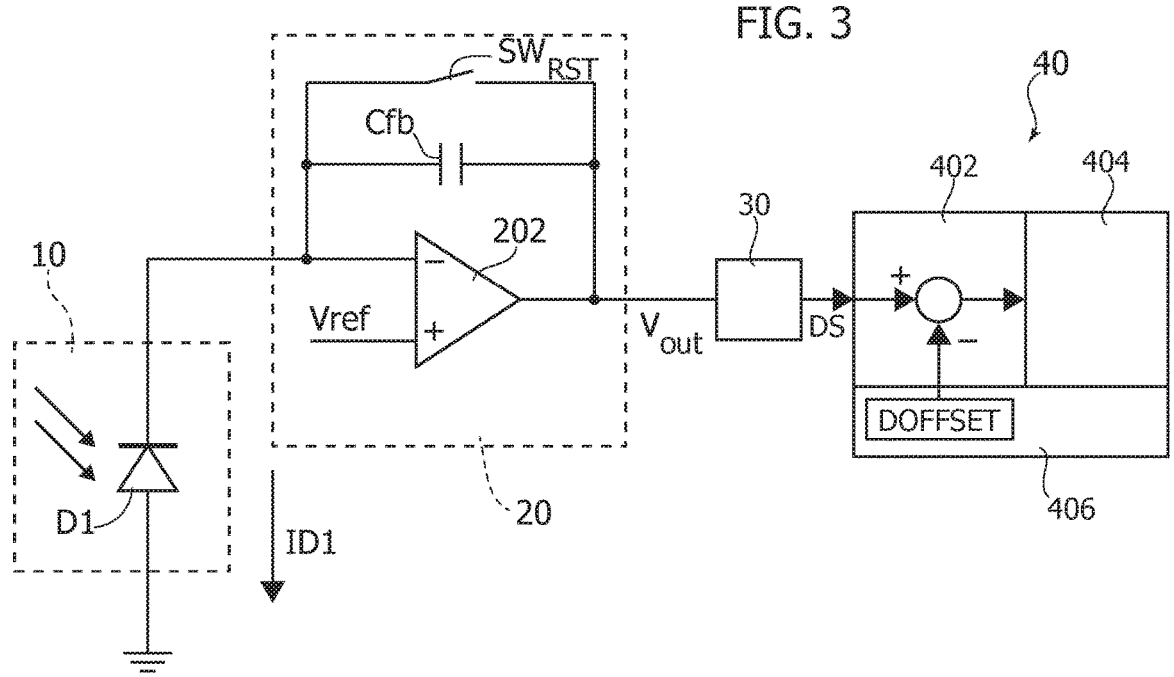
FIG. 3 shows a first example of an offset compensation for the amplification interface of FIG. 2.
Figure 4:
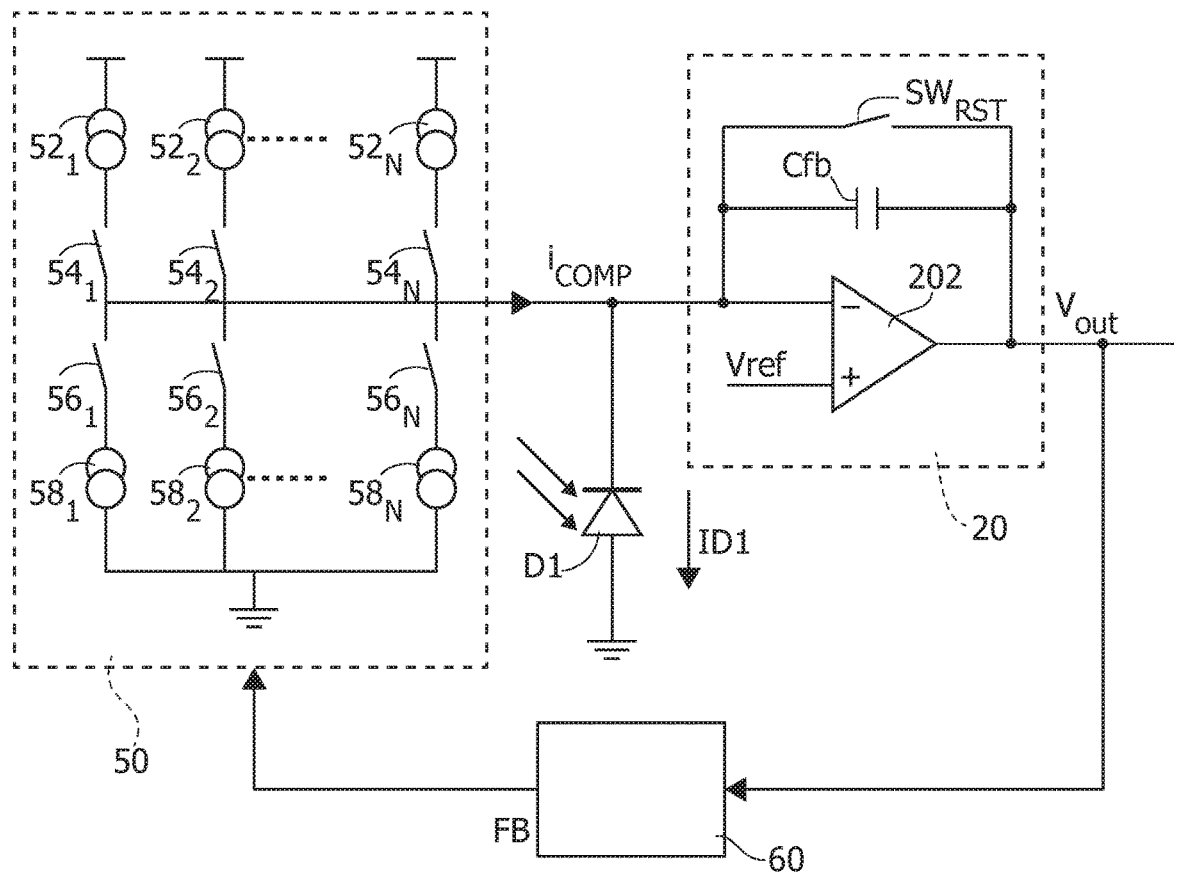
FIG. 4 shows a second example of an offset compensation for the amplification interface of FIG. 2.
Figure 5:
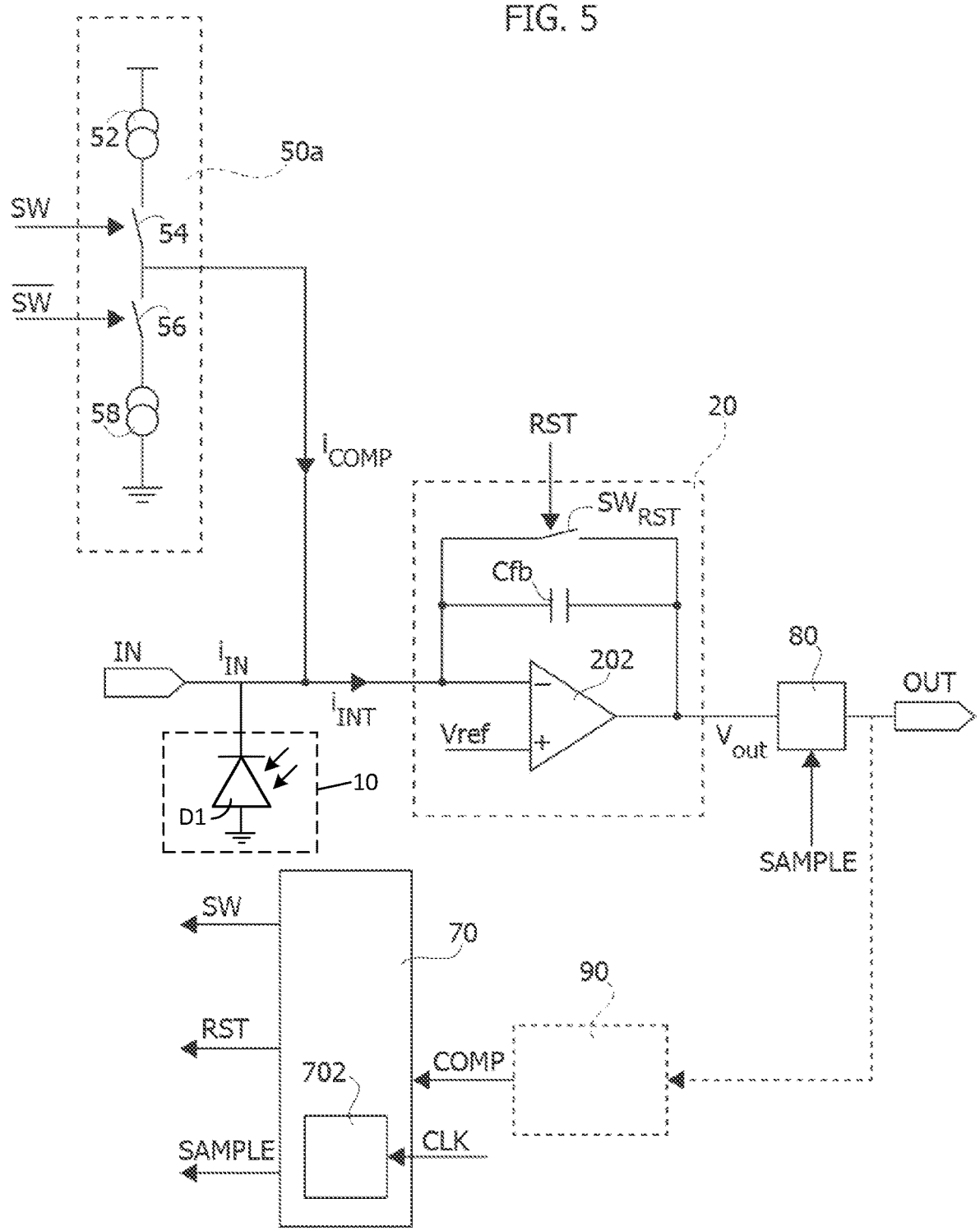
FIG. 5 shows an embodiment of an offset compensation for the amplification interface of FIG. 2.
Figure 6:
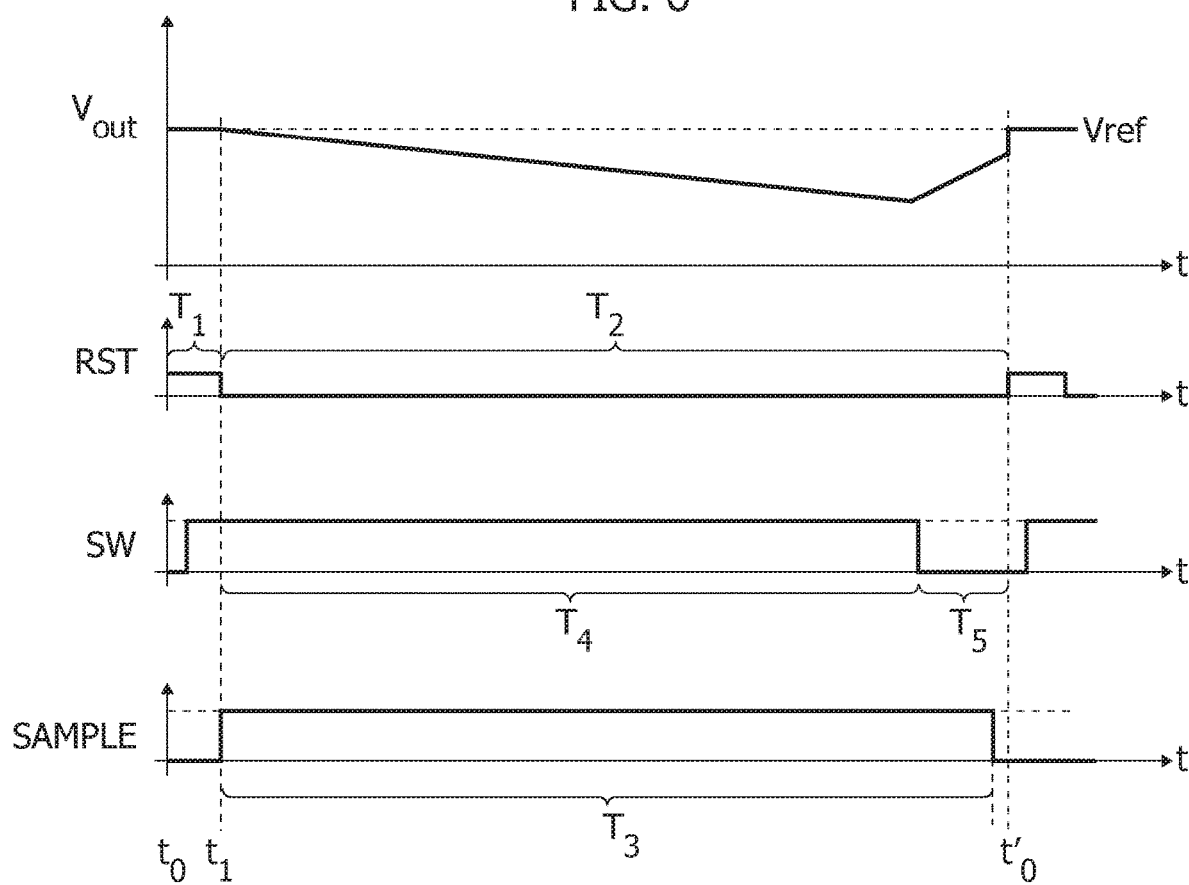
FIGS. 6 and 7 show embodiments of driving of the amplification interface of FIG. 5.
Figure 7:
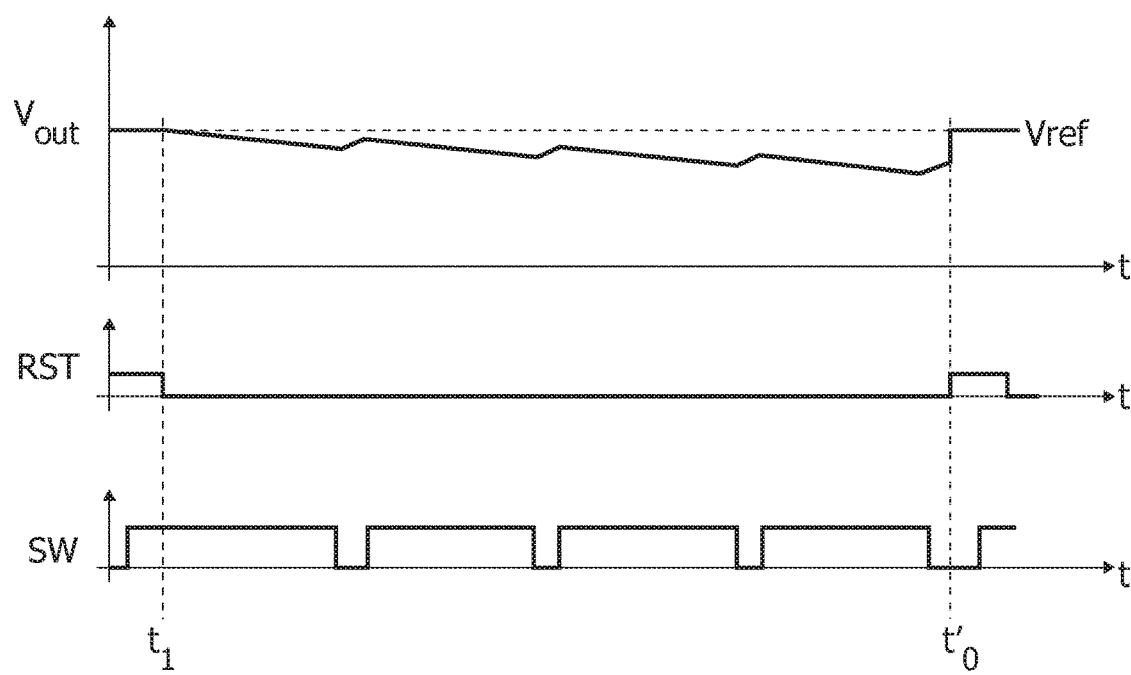

In FIGS. 5 to 7 described below, parts, elements or components that have already been described with reference to FIGS. 1 to 4 are designated by the same references used previously in these figures. The description of these elements has already been made and will not be repeated in what follows in order not to burden the present detailed description.

As explained previously, various embodiments of the present description regard an electronic amplification interface for a sensor 10, in particular a sensor 10 configured for supplying a measurement current signal representing a quantity to be measured.

FIG. 5 shows a first embodiment of an electronic amplification interface according to the present description.

In particular, in the embodiment considered, the electronic amplification interface comprises an input terminal IN for receiving an input current $i_{IN}$, and an output terminal OUT for supplying an output voltage $V_{out}$. Consequently, in line with what has been described with reference to FIG. 1, the input terminal IN may be connected to a sensor 10, and the terminal OUT may be connected to an A/D converter 30 or directly to a processing circuit 40. In general, the amplification interface and the A/D converter 30 and/or the processing circuit 40 may even be integrated in a single integrated circuit.

In the embodiment considered, the electronic amplification interface comprises an analog integrator 20. Operation of such an analog integrator 20 has already been described with reference to FIG. 2 and the corresponding description applies entirely.

In general, the analog integrator 20 comprises an input connected (for example, directly) to the input terminal IN, and an output that supplies the output voltage $V_{out}$. In particular, the analog integrator 202 is configured for supplying a voltage $V_{out}$ representing the integral of the current $i_{INT}$ received at input to the analog integrator 20.

For example, in the embodiment considered, the analog integrator 20 is implemented with:
  an operational amplifier 202, where a first input terminal of the operational amplifier 202 (typically the negative terminal) is connected to the input of the analog integrator 20, i.e., the terminal IN, and the second input terminal of the operational amplifier 202 (typically the positive terminal) is connected to a reference voltage Vref; and
  a capacitor Cfb, connected (for example, directly) between the first input terminal of the operational amplifier 202 and the output terminal of the operational amplifier 202.

Hence, in the embodiment considered, the analog integrator 202 is configured for charging the capacitor Cfb as a function of the current $i_{INT}$ received at input to analog integrator 20. In addition, since the output voltage $V_{out}$ corresponds to the sum of the reference voltage Vref (which is constant and may even be zero) and the voltage across the capacitor Cfb, the output voltage $V_{out}$ is directly linked to the integral of the current $i_{INT}$.

In the embodiment considered, the analog integrator further comprises a reset circuit, configured for selectively discharging the capacitor Cfb. For example, in the embodiment considered, the reset circuit is implemented with an electronic switch $SW_{RST}$ connected in parallel to the capacitor Cfb.

In various embodiments, the analog integrator may also comprise a sample-and-hold circuit 80. In particular, this circuit represents an analog memory configured for storing the value of the voltage $V_{out}$ as a function of a control signal SAMPLE. For example, in the simplest case, such a circuit 80 may be implemented with a capacitor, which is selectively connected, for example through one or more electronic switches, to the voltage $V_{out}$ as a function of the signal SAMPLE.

For instance, for this purpose, the reset signal RST and the signal SAMPLE are generated by a single control circuit 70, which sets the reset signal RST in a first time interval $T_1$ at a first logic level (typically high) for resetting the analog integrator and in a second time interval $T_2$ at a second logic level (typically low) for activating the analog integrator. Consequently, the interval $T_2$ represents a measurement interval that corresponds to the period of integration used by the analog integrator 20. In various embodiments, the time intervals $T_1$ and $T_2$ are constant.

In general, on the basis of the implementation of the circuit 80, the signal SAMPLE may also correspond to the reset signal RST or to its inverted version. However, preferably, the control circuit 70 is configured for generating the signal SAMPLE so as to cause sampling of the voltage $V_{out}$ through the circuit 80 before the reset signal RST is set for discharging the capacitor Cfb; i.e., with respect to activation of the analog integrator 20 (switching of the signal RST from the second logic level to the first level), the signal SAMPLE is set after an interval $T_3$, which is shorter than the interval $T_2$, i.e., $T_3<T_2$.

In the embodiment considered, the electronic amplification interface further comprises a current generator 50a. In particular, in various embodiments, the current generator 50a comprises an output for supplying a current $i_{COMP}$, where the output of the current generator 50a is connected to the input terminal IN, i.e., the input of the analog integrator 20. Consequently, the current $i_{INT}$ received at input to the analog integrator 20 corresponds to:

$$i_{INT}=i_{COMP}+i_{IN} \quad (3)$$

In various embodiments, the current generator 50a is configured for generating the current $i_{COMP}$ as a function of at least one control signal. For example, in the embodiment considered, a single control signal SW is used, where the current generator 50a is configured for supplying:
  a positive current $i_{COMP}=i_1$, with $i_1>0$, when the control signal SW has a first logic level; and
  a negative current $i_{COMP}=i_2$, with $i_2<0$, when the control signal SW has a second logic level.

For example, in the embodiment considered, the current generator 50a comprises:
  a first current generator 52 configured for supplying the current $i_1$;
  a first electronic switch 54 configured for connecting the first current generator 52 to the output of the current generator 50a, i.e., to the input of the integrator 20, when the control signal SW has the first logic level;
  a second current generator 58 configured for supplying the current $i_2$; and
  a second electronic switch 56 configured for connecting the second current generator 52 to the output of the current generator 50a, i.e., to the input of the integrator 20, when the control signal SW has the second logic level.

Consequently, in the embodiment considered, the current generator 50a supplies alternatively the current $i_1$ or $i_2$ as a function of the control signal SW. In various embodiments, the currents $i_1$ or $i_2$ have the same amplitude but opposite sign, i.e., $i_1 = -i_2$. In addition, in various embodiments, the currents $i_1$ and $i_2$ are constant.

Hence, as compared to the approach described with reference to FIG. 4, the current generator 50a supplies two possible current levels. Instead, in FIG. 4, the current generator 50 supplies N levels both for positive currents and for negative currents. Hence, apparently, the approach shown in FIG. 5 presents a considerably lower resolution. However, as will be explained herein, the present approach enables calibration of the offset with a high resolution of correction (and hence a low residual error) and without requiring the use of low unit currents.

In particular, as described previously, the current generator 50a has a single branch configured for supplying a positive current ($i_1$) or a negative current ($i_2$). Preferably, the currents have the same amplitude, denoted hereinafter by IFS, which represents the full-scale current value, i.e., the maximum offset current that can be corrected.

The main difference from the solution shown in FIG. 4 lies in the fact that the current $i_{COMP}$ supplied by the current generator is not set at a fixed value, but the control signal SW is used for switching the current $i_{COMP}$ supplied by the current generator between the values $i_1$/IFS and $i_2$/–IFS in such a way as to reach on average (for each measurement interval) a required value.

For this purpose, the control circuit 70 is also configured for generating the control signal SW for the current generator 50a in such a way as to synchronize the control signal SW with switching of the reset signal RST for the analog integrator 20.

FIG. 6 shows possible operation of the control circuit 70.

In particular, as explained previously, the control circuit 70 generates the reset signal RST; in particular the control circuit 70 is configured for repeating periodically the following operations:

at an instant $t_0$, the signal RST is set at a first logic level (high) for resetting the analog integrator 20; and
at an instant $t_1$, the signal RST is set at a second logic level (low), thus determining the end of the reset step, whereas the signal SAMPLE is set at a logic level (high), thus determining start of the integration step.

Consequently, the time interval between the instants $t_0$ and $t_1$ corresponds to the reset interval $T_1$, whereas the time interval between the instant $t_1$ and the subsequent instant $t_0'$ corresponds to the measurement interval $T_2$. In various embodiments, between the instant $t_0$ and $t_1$ the signal SW is set at the first logic level (high).

In the embodiment considered, also an example of the signal SAMPLE is shown. In particular, as explained previously, the signal SAMPLE stores the value of the voltage $V_{out}$ before the analog integrator 20 is reset. For example, for this purpose, the signal SAMPLE can be set with respect to start of the measurement interval $T_2$ (i.e., with respect to the instant $t_1$) for a sampling time $T_3$ at a first logic value, in which the circuit 80 stores the value of the signal $V_{out}$, and for a hold time $(T_2-T_3)$ it does not store the value of the signal $V_{out}$ and holds the value stored at the end of the interval $T_3$. Consequently, to enable a comparison of different measured values, the duration of the measurement interval $T_2$ is not particularly important, but the sampling time $T_3$ should be constant.

As explained previously, the control circuit 70 also generates the control signal SW for the current generator 50a. In particular, during each measurement interval $T_2$, the control circuit 70 sets the signal SW at the first logic level (generation of the current $i_1$/IFS) for an interval $T_4$ and at the second logic level (generation of the current $i_2$/–IFS) for an interval $T_5 = T_2 - T_4$. In general, switching during the reset interval $T_1$ is not particularly important, since the analog integrator is de-activated during this step.

Consequently, the control signal SW is characterized in that (within each integration period $T_2$) it activates the current $i_1$/IFS for an interval $T_4$ and activates the current $i_2$/–IFS for an interval $T_5$.

In particular, in the embodiment shown in FIG. 6, a single interval $T_4$ is used at start of the measurement interval $T_2$, and a single interval $T_5$ is used at the end of the measurement interval $T_2$. Instead, FIG. 7 shows an embodiment in which the time interval $T_4$ and the time interval $T_5$ are obtained by a plurality of sub-intervals that have the total durations $T_4$ and $T_5$, respectively.

Consequently, in the embodiment considered, the time interval $T_2$ can be divided into an even number of sub-intervals, referred to hereinafter as 2N, i.e., each sub-interval has a duration $T_2/(2N)$.

For example, in various embodiments, the control circuit 70 generates the reset signal RST using a counter/timer 702 configured for incrementing a count value as a function of a clock signal CLK (see also FIG. 5) and for setting the logic level of the reset signal RST by comparing the count value with at least one threshold that identifies the duration of the measurement interval $T_2$. Consequently, in this case, the period $T_{CLK}$ of the clock signal CLK corresponds to the minimum duration of each of the 2N sub-intervals. However, in general, each sub-interval may also have a duration $T_2/(2N)$ that corresponds to a multiple of the time $T_{CLK}$.

Hence, the duration $T_4$ may be determined by a control signal COMP that identifies the number of sub-intervals during which the control signal SW should have the first logic level, i.e.:

$$T_4 = COMP \frac{T_2}{2N} \qquad (4)$$

Instead, the duration $T_5$ can be calculated from the duration $T_4$; namely:

$$T_5 = T_2 - COMP \frac{T_2}{2N} \qquad (5)$$

In general, when the sensor 10 does not comprise any offset, for example, in the absence of a sensor 10 connected to the input terminal IN of the electronic amplification interface, the time interval $T_5$ corresponds to the duration $T_4$, i.e.:

$$T_5 = T_4 = \frac{T_2}{2} \qquad (6)$$

Consequently, in various embodiments, the duration $T_2/2$ may correspond to a default duration, and the signal COMP may also indicate the number of sub-intervals by which this default duration may be increased or decreased; for example:

$$T_4 = \frac{T_2}{2} - COMP\frac{T_2}{2N} \quad (7)$$

$$T_5 = \frac{T_2}{2} + COMP\frac{T_2}{2N} \quad (8)$$

For instance, in the case where the signal COMP has the value $-N$, $T_4$ is equal to $T_2$, and $T_5$ is zero. Instead, in the case where the signal COMP has the value $+N$, $T_4$ is zero, and $T_5$ is equal to $T_2$. In any case, typically the durations $T_4$ and $T_5$ are not zero.

In various embodiments, the output voltage $V_{out}$ may hence correspond to:

$$V_{out} = -\frac{I_{FS}}{Cfb}T_4 + \frac{I_{FS}}{Cfb}T_5 + \frac{ID1}{Cfb}T_2 \quad (9)$$

For example, using the definition of the signal COMP appearing in Eqs. (7) and (8), the output voltage $V_{out}$ corresponds to:

$$V_{out} = -\frac{T_2}{Cfb}\left(i_{FS}\frac{COMP}{N} + ID1\right) \quad (10)$$

From a mathematical standpoint, the result of Eq. (9) is hence equal to the result of Eq. (2); i.e., the system proposed is able to provide the same correction as the system shown in FIG. 4. Also in this case, the control word COMP is an integer (comprised between $-N$ and $+N$). Hence, in a way similar to what has been described with reference to FIG. 4, the offset current can be corrected within a range between $-I_{FS}$ and $+I_{FS}$ with a correction resolution equal to $I_{FS}/N$. The residual error deriving from offset correction may be comprised between $-0.5 \cdot (I_{FS}/N)$ and $0.5 \cdot (I_{FS}/N)$, and this residual error may lead to an output signal that may not be zero after offset calibration but may be comprised between $-0.5 \cdot (T_2/Cfb) \cdot (I_{FS}/N)$ and $0.5 \cdot (T_2/Cfb) \cdot (I_{FS}/N)$.

However, whereas the approach shown in FIG. 4 is based on a plurality of current generators that use a high precision, the present approach is based upon switching in time, which can be controlled more easily. If, for example, $(T_2/Cfb)=100 \cdot 10^6$ and the residual error from the correction is to be limited at $+/-0.05$ V, assuming that the current $I_{FS}$ is 100 nA, then the number N should be equal to 100.

There is thus overcome the main limit of the approach shown in FIG. 4, where to reduce further the residual error from the offset correction, the road is to decrease the unit current of the branch of the DAC ($I_{FS}/N$). In the approach proposed, to increase the resolution it is sufficient to increase the number of sub-intervals of the signal SW, and this can be easily obtained considering a clock frequency CLK that is sufficiently high for obtaining the desired resolution.

As shown in FIG. 5, in the calibration step and in the absence of signal applied, the word COMP can be chosen and fixed to the value that renders Eq. (8) as close as possible to zero. For example, in the embodiments shown in FIG. 5, a circuit 90 is configured for measuring the output voltage $V_{out}$ and for varying the signal COMP. In general, this circuit 90 may be implemented as a circuit that is external to the amplification interface or may also be integrated in the amplification interface. For example, for this purpose, it is possible to use the processing circuit 40, which could also implement the control circuit 70 directly.

While the approach has been described with reference to a sensor 10 that supplies a current signal of the single-ended type, the approach could be used also when the sensor supplies a current signal of a differential type. For example, the sensor 10 can supply such a differential signal when in actual fact the sensor itself comprises two sensors:

a first sensor that supplies a first current, where the first sensor is exposed to the quantity to be measured; and a second sensor that supplies a second current, where the second sensor is not exposed to the quantity to be measured; i.e., the sensor represents a reference sensor.

In this case, the circuit shown in FIG. 5 can hence be doubled so that the first circuit is used for the first sensor and the second circuit is used for the second sensor, and the output signal may correspond to the voltage between the output terminals OUT of the two circuits. Alternatively, it is also possible to use directly a differential current integrator as described, for example, in the paper by A. Youssef, Mohamed & Soliman, A. M., "A Novel CMOS Realization of the Differential Input Balanced Output Current Operational Amplifier and its Applications", Analog Integrated Circuits and Signal Processing 44(1):37-53, July 2005, DOI: 10.1007/s10470-005-1613-2 (incorporated by reference).

The claims form an integral part of the technical teaching of the description provided herein.

Of course, without prejudice to the principles described herein, the details of construction and the embodiments may vary widely with respect to what has been described and illustrated herein purely by way of example, without thereby departing from the scope of this disclosure as defined by the ensuing claims.

The invention claimed is:

1. An amplification interface, comprising:
   an input terminal configured to receive a sensor current;
   an output terminal configured to provide an output voltage;
   an analog integrator, wherein an input of said analog integrator is connected to the input terminal, wherein an output of said analog integrator provides said output voltage, wherein said analog integrator is configured to be reset or activated via a reset signal, wherein:
   when said analog integrator is reset, said output voltage corresponds to a reference voltage; and
   when said analog integrator is activated, said output voltage varies as a function of a current received at the input of said analog integrator;
   a current generator, wherein an output of said current generator is connected to the input of said analog integrator, wherein said current generator is configured to generate at the output of said current generator a compensation current as a function of a drive signal;
   a control circuit configured to:
   generate said reset signal, such that said analog integrator is periodically reset during a reset interval and activated during a measurement interval;
   receive a control signal indicative of an offset in said sensor current; and
   generate said drive signal as a function of said control signal indicative of the offset in said sensor current;

wherein said current generator is configured to:
   when said drive signal has a first logic value, generate at the output of said current generator a positive current; and
   when said drive signal has a second logic value, generate at the output of said current generator a negative current; and
wherein said control circuit is further configured to:
   determine a first duration and a second duration as a function of said control signal indicative of the offset in said sensor current, wherein a sum of said first duration and said second duration corresponds to a duration of said measurement interval; and
   during said measurement interval, set said drive signal to said first logic value for said first duration and set said drive signal to said second logic value for said second duration.

2. The amplification interface according to claim 1, wherein said positive current and said negative current have a same amplitude but opposite signs.

3. The amplification interface according to claim 1, wherein said current generator comprises:
   a first current generator configured to generate said positive current; and
   a second current generator configured to generate said negative current.

4. The amplification interface according to claim 3, wherein said current generator comprises:
   circuitry to selectively enable said first current generator or said second current generator as a function of said drive signal; or
   circuitry to selectively connect said first current generator or said second current generator to the output of said current generator as a function of said drive signal.

5. The amplification interface according to claim 1, wherein said control circuit is configured to generate said reset signal and said drive signal via a counter circuit in a synchronous manner in response to a clock signal.

6. The amplification interface according to claim 5, wherein said measurement interval corresponds to an even number of 2N sub-intervals, wherein a duration of each sub-interval corresponds to a multiple of a period of said clock signal, wherein N is an integer.

7. The amplification interface according to claim 6, wherein said control circuit is configured to determine said first duration, $T_4$, and said second duration, $T_5$, as:

$$T_4 = \frac{T_2}{2} - COMP\frac{T_2}{2N}$$

$$T_5 = \frac{T_2}{2} + COMP\frac{T_2}{2N}$$

where $T_2$ is the duration of said measurement interval, and COMP is an integer number between $-N$ and $+N$ and corresponds to said control signal indicative of an offset in said sensor current.

8. The amplification interface according to claim 1, wherein said analog integrator comprises an operational amplifier, wherein a first input terminal of said operational amplifier is connected via a capacitor to an output terminal of said operational amplifier and a second input terminal of said operational amplifier is connected to a reference voltage.

9. The amplification interface according to claim 8, wherein said analog integrator comprises an electronic switch connected in parallel with said capacitor, and wherein said electronic switch is configured to:
   when said reset signal has a first logic value, close said electronic switch; and
   when said reset signal has a second logic value, open said electronic switch.

10. The amplification interface according to claim 1, further comprising a sample-and-hold circuit configured to:
   when a sampling signal has a first logic value, store said output voltage at the output of said analog integrator; and
   when said sampling signal has a second logic value, maintain stored said output voltage at the output of said analog integrator;
wherein said control circuit is further configured to, during said measurement interval, set said sampling signal to said first logic value for a sampling duration and set said sampling signal to said second logic value for a hold duration.

11. A method of calibrating the amplification interface of claim 1, the method comprising:
   connecting said sensor current to the input terminal of said amplification interface;
   monitoring, at an end of said measurement interval, the output voltage at the output terminal of said amplification interface; and
   varying said control signal such that said monitored output voltage corresponds to said reference voltage.

12. A measurement system, comprising:
an amplification interface;
a sensor connected to an input terminal of said amplification interface; and
a processing circuit connected to an output terminal of said amplification interface;
wherein the amplification interface comprises:
   an input terminal configured to be connected to said sensor, said sensor providing a sensor current, said input terminal further configured to be connected to an output terminal for providing an output voltage;
   an analog integrator, wherein an input of said analog integrator is connected to the input terminal, wherein an output of said analog integrator provides said output voltage, wherein said analog integrator is configured to be reset or activated via a reset signal, wherein:
      when said analog integrator is reset, said output voltage corresponds to a reference voltage, and
      when said analog integrator is activated, said output voltage varies as a function of a current received at the input of said analog integrator;
   a current generator, wherein an output of said current generator is connected to the input of said analog integrator, wherein said current generator is configured to generate at the output of said current generator a compensation current as a function of a drive signal;
   a control circuit configured to:
      generate said reset signal, such that said analog integrator is periodically reset during a reset interval and activated during a measurement interval,
      receive a control signal indicative of an offset in said sensor current provided by said sensor, and
      generate said drive signal as a function of said control signal indicative of an offset in said sensor current provided by said sensor;

wherein said current generator is configured to:
when said drive signal has a first logic value, generate at the output of said current generator a positive current, and
when said drive signal has a second logic value, generate at the output of said current generator a negative current; and
wherein said control circuit is further configured to:
determine a first duration and a second duration as a function of said control signal indicative of an offset in said sensor current provided by said sensor, wherein a sum of said first duration and said second duration corresponds to a duration of said measurement interval, and
during said measurement interval, set said drive signal to said first logic value for said first duration and set said drive signal to said second logic value for said second duration.

13. The measurement system according to claim 12, wherein said positive current and said negative current have a same amplitude but opposite signs.

14. The measurement system according to claim 12, wherein said current generator comprises:
a first current generator configured to generate said positive current; and
a second current generator configured to generate said negative current.

15. The measurement system according to claim 14, wherein said current generator comprises:
circuitry for selectively enabling said first current generator or said second current generator as a function of said drive signal; or
circuitry for selectively connecting said first current generator or said second current generator to the output of said current generator as a function of said drive signal.

16. The measurement system according to claim 12, wherein said control circuit is configured to generate said reset signal and said drive signal via a counter circuit in a synchronous manner in response to a clock signal.

17. An amplification interface, comprising:
an analog integrator having an input receiving a sensor current, wherein said analog integrator is configured to be reset or activated in response to a reset signal;
a current generator having an output connected to the input of said analog integrator, wherein said current generator is configured to generate a compensation current as a function of a drive signal;
a control circuit configured to:
generate said reset signal such that said analog integrator is periodically reset during a reset interval and activated during a measurement interval; and
generate said drive signal based upon an offset in said sensor current;
wherein said current generator is further configured to generate a first current or a second current based upon a logic value of the drive signal; and
wherein said control circuit is further configured to:
determine a first duration and a second duration, wherein a sum of said first duration and said second duration corresponds to a duration of said measurement interval; and
during said measurement interval, set said drive signal to a first logic value for said first duration and set said drive signal to a second logic value for said second duration.

18. The amplification interface according to claim 17, wherein said control circuit is configured to generate said reset signal and said drive signal via a counter circuit in a synchronous manner in response to a clock signal.

19. The amplification interface according to claim 18, wherein said measurement interval corresponds to an even number of 2N sub-intervals, wherein a duration of each sub-interval corresponds to a multiple of a period of said clock signal, wherein N is an integer.

20. The amplification interface according to claim 19, wherein said control circuit is configured to determine said first duration, $T_4$, and said second duration, $T_5$, with the following equations:

$$T_4 = \frac{T_2}{2} - COMP\frac{T_2}{2N}$$

$$T_5 = \frac{T_2}{2} - COMP\frac{T_2}{2N}$$

where $T_2$ is the duration of said measurement interval, and COMP is an integer number between $-N$ and $+N$ and corresponding to a control signal indicative of an offset in said sensor current.

21. The amplification interface according to claim 17, wherein said analog integrator comprises an operational amplifier, wherein a first input terminal of said operational amplifier is connected via a capacitor to an output terminal of said operational amplifier and a second input terminal of said operational amplifier is connected to a reference voltage.

* * * * *